(12) United States Patent
Kiryu et al.

(10) Patent No.: US 9,502,797 B2
(45) Date of Patent: Nov. 22, 2016

(54) CONTACT

(71) Applicant: FUJITSU COMPONENT LIMITED, Tokyo (JP)

(72) Inventors: Koichi Kiryu, Nagano (JP); Mitsuru Kobayashi, Tokyo (JP)

(73) Assignee: FUJITSU COMPONENT LIMITED, Tokyo (JP)

( * ) Notice: Subject to any disclaimer, the term of this patent is extended or adjusted under 35 U.S.C. 154(b) by 0 days.

(21) Appl. No.: 14/446,497

(22) Filed: Jul. 30, 2014

(65) Prior Publication Data

US 2015/0038001 A1 Feb. 5, 2015

(30) Foreign Application Priority Data

Aug. 2, 2013 (JP) .................................. 2013-161225

(51) Int. Cl.
*H01R 12/71* (2011.01)
*H01R 13/24* (2006.01)
*H01R 13/62* (2006.01)
*H01R 12/57* (2011.01)
*H05K 3/36* (2006.01)
*H01R 4/64* (2006.01)

(52) U.S. Cl.
CPC .......... *H01R 12/714* (2013.01); *H01R 12/718* (2013.01); *H01R 13/2442* (2013.01); *H01R 13/62* (2013.01); *H01R 4/64* (2013.01); *H01R 12/57* (2013.01); *H01R 13/245* (2013.01); *H05K 3/368* (2013.01); *H05K 2201/1031* (2013.01); *Y02P 70/611* (2015.11)

(58) Field of Classification Search
CPC .................. H01R 12/57; H01R 12/714; H01R 12/718; H01R 12/73; H01R 13/24; H01R 13/62
USPC ............................................ 439/66, 370, 884
See application file for complete search history.

(56) References Cited

U.S. PATENT DOCUMENTS

| 6,551,149 | B2 * | 4/2003 | Orihara | .......................... 439/862 |
| 7,131,875 | B2 * | 11/2006 | Kodaira | ............. H01R 13/2442 439/862 |
| 7,140,895 | B2 * | 11/2006 | Tuin et al. | ..................... 439/246 |
| 7,381,086 | B1 * | 6/2008 | Gilmore | ............... H01R 11/282 439/500 |
| 7,806,739 | B2 * | 10/2010 | Hu | ..................... H01R 13/2442 439/862 |

(Continued)

FOREIGN PATENT DOCUMENTS

| EP | 1381116 | 1/2004 |
| JP | 2001-053457 | 2/2001 |
| JP | 2002-015801 | 1/2002 |

*Primary Examiner* — Amy Cohen Johnson
*Assistant Examiner* — Oscar C Jimenez
(74) *Attorney, Agent, or Firm* — IPUSA, PLLC

(57) ABSTRACT

A contact that electrically connects a first board and a second board includes a bottom part to be joined to the first board, a first spring that is bent and extends from the bottom part, a second spring configured to be displaced in a first direction toward the bottom part and in a second direction opposite to the first direction by the bending of the first spring, multiple side guides rising from the bottom part, and a stopper provided at an end of each of the side guides in the second direction and configured to come into contact with the second board. The side guides include respective extension parts configured to protect an area in which the second spring is displaced.

10 Claims, 18 Drawing Sheets

(56) References Cited

U.S. PATENT DOCUMENTS

| | | | |
|---|---|---|---|
| 7,938,647 B2 * | 5/2011 | Zheng et al. | 439/66 |
| 8,070,498 B2 * | 12/2011 | Shen | 439/66 |
| 8,298,021 B2 * | 10/2012 | Huang | H01R 13/2442 |
| | | | 439/500 |
| 8,926,338 B2 * | 1/2015 | Kiryu et al. | 439/66 |
| 2011/0053389 A1 | 3/2011 | Zheng et al. | |
| 2012/0135647 A1 * | 5/2012 | Yu et al. | 439/824 |
| 2014/0004760 A1 * | 1/2014 | Kiryu | H01R 13/05 |
| | | | 439/884 |

* cited by examiner

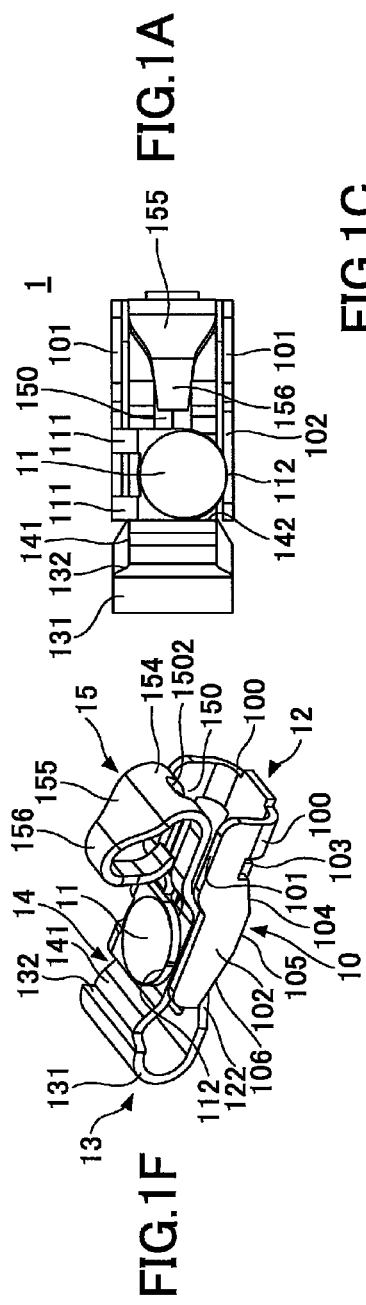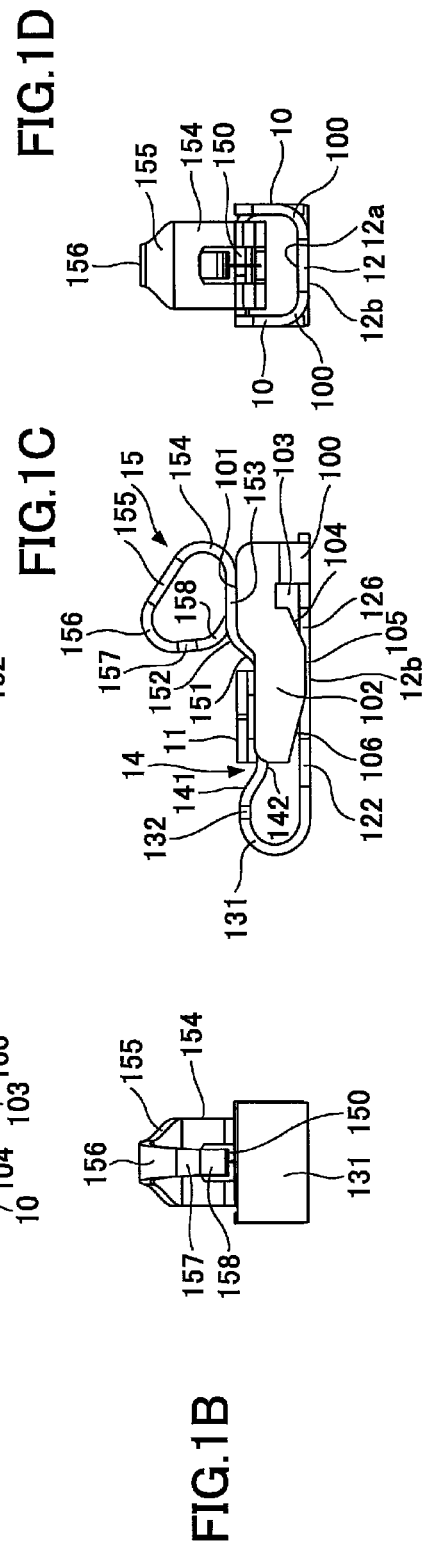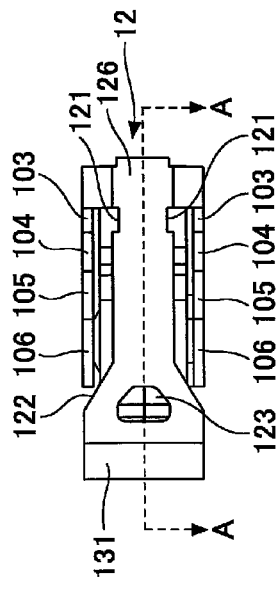

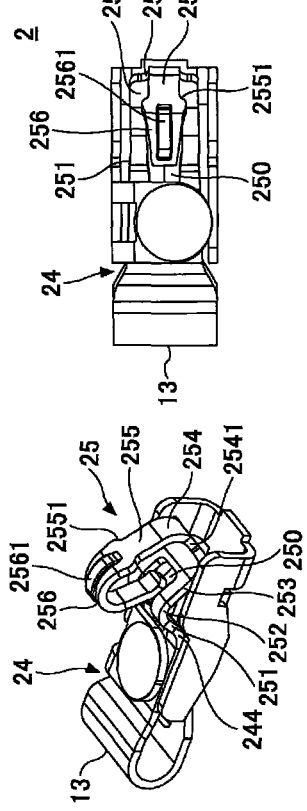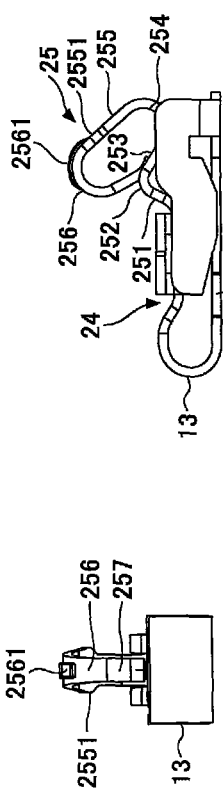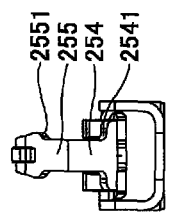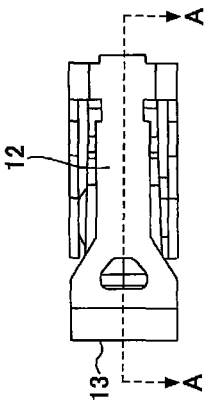

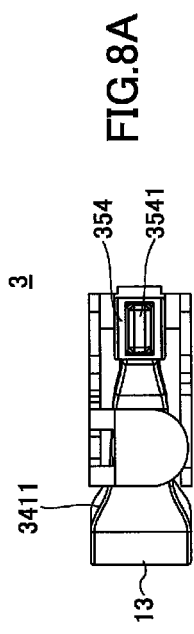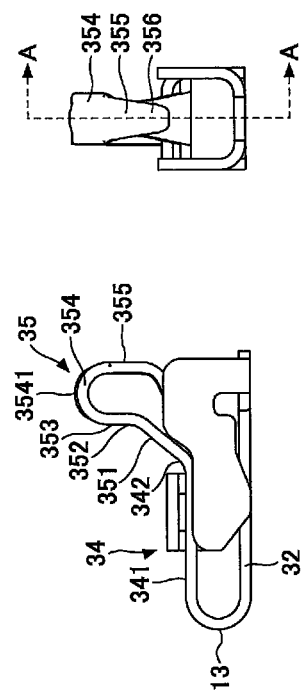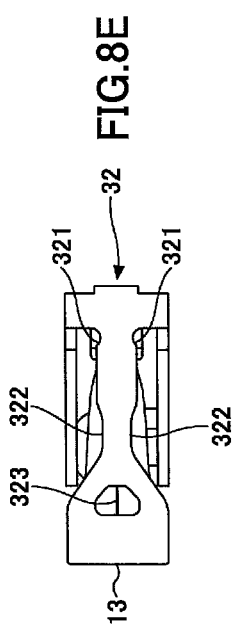

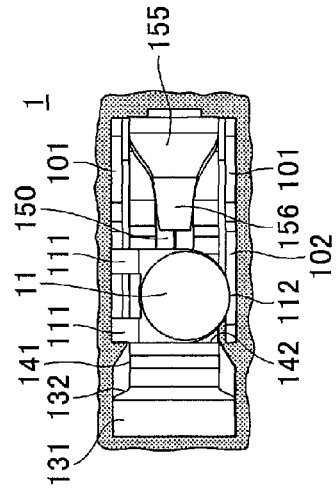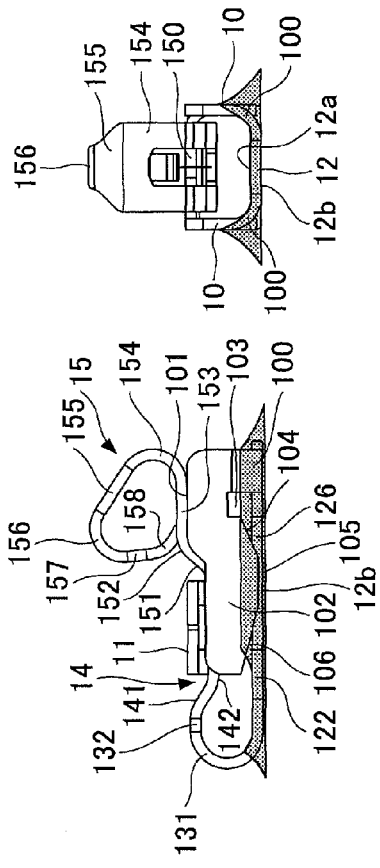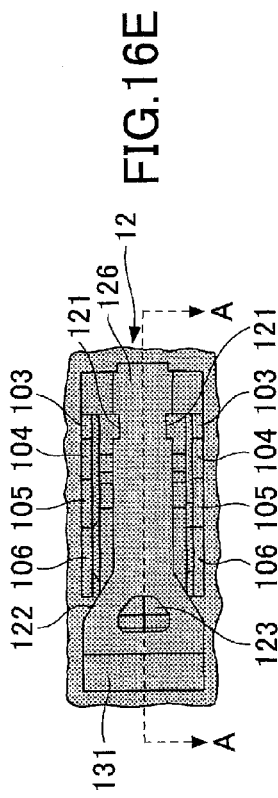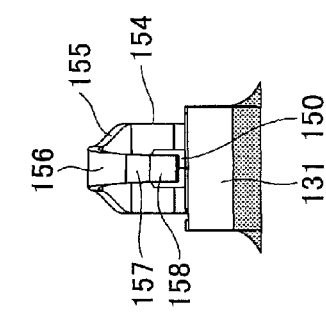

CONTACT

CROSS-REFERENCE TO RELATED APPLICATION

The present application is based upon and claims the benefit of priority of Japanese Patent Application No. 2013-161225, filed on Aug. 2, 2013, the entire contents of which are incorporated herein by reference.

BACKGROUND OF THE INVENTION

1. Field of the Invention

The present invention relates to contacts.

2. Description of the Related Art

Electronic apparatuses such as cellular phones and smartphones have been reduced in size and thickness, and in response to this, the form of mounting parts on a printed circuit board (hereinafter abbreviated to "board") provided inside apparatuses has mostly shifted to the surface mounting of chip parts.

In these electronic apparatuses, a ground (GND) line of the board is connected to a conductor panel of the enclosure (so-called frame grounding [FG]) in order to protect electronic parts mounted on the board and to deal with noise. Frame grounding is also performed between boards. In this case, a surface-mount contact is used to connect respective conductors of the boards.

The contact used in FG is a member having a spring characteristic, formed by bending a leaf spring to have a predetermined amount of stroke. The contact is joined to a conductor of one of the boards and is compressed by being pressed by the other of the boards to electrically connect the conductors of the boards.

A spring part of the contact may be broken if a load is applied on the spring part from a lateral direction perpendicular to the stroke directions of the contact. Therefore, for example, Japanese Laid-Open Patent Application No. 2002-015801 proposes a terminal member including protection walls that longitudinally cover both sides of a contact point part elastically deformed in a direction to approach a fixation part of a spring part.

SUMMARY OF THE INVENTION

According to an aspect of the invention, a contact that electrically connects a first board and a second board includes a bottom part to be joined to the first board, a first spring that is bent and extends from the bottom part, a second spring configured to be displaced in a first direction toward the bottom part and in a second direction opposite to the first direction by the bending of the first spring, multiple side guides rising from the bottom part, and a stopper provided at an end of each of the side guides in the second direction and configured to come into contact with the second board. The side guides include respective extension parts configured to protect an area in which the second spring is displaced.

BRIEF DESCRIPTION OF THE DRAWINGS

FIGS. 1A, 1B, 1C, 1D, 1E and 1F are a plan view, a left side view, a front view, a right side view, a bottom view, and a perspective view, respectively, of a contact according to a first embodiment;

FIGS. 5A, 5B, 5C, 5D, 5E and 5F are a plan view, a left side view, a front view, a right side view, a bottom view, and a perspective view, respectively, of a contact according to a second embodiment;

FIGS. 8A, 8B, 8C, 8D and 8E are a plan view, a left side view, a front view, a right side view, and a bottom view, respectively, of a contact according to a third embodiment;

FIGS. 16A, 16B, 16C, 16D and 16E are diagrams illustrating formation of a fillet on a contact according to the first embodiment.

DESCRIPTION OF THE EMBODIMENTS

Figure 2:
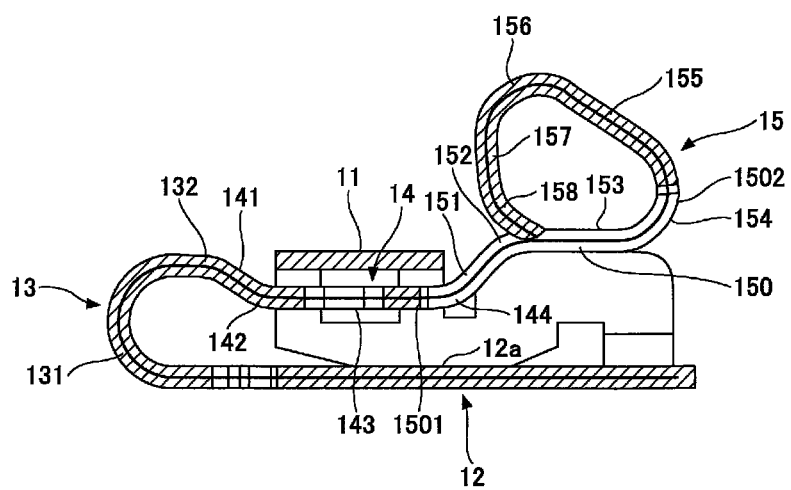
FIG. 2 is a cross-sectional view of the contact taken along a plane including line A-A in FIG. 1E.

A contact according to an embodiment of the present invention electrically connects contacts provided on boards opposed to each other, and is formed of a material having a spring characteristic. The contact is soldered to one of the boards, and obtains a force to contact the other of the boards ("opposed board") by the displacement of a spring of the contact in a stroke direction caused by the pressing of the contact by the opposed board. The contact obtains a stabler electrical connection with a stronger contact force under an allowable load that is the limit of elasticity of the spring.

As a material for the contact, an electrically-conductive metal plate that has a spring characteristic is used. Examples of such metal plates include those of phosphor bronze, beryllium copper, and stainless steel. The contact may be formed by, for example, performing press working on a metal plate having a spring characteristic (hereinafter referred to "leaf spring") of 0.08 mm to 0.15 mm in thickness. Furthermore, the contact may be partly or entirely plated with nickel, copper, or gold as desired.

Embodiments of the present invention are described below with reference to the drawings.

[First Embodiment]

A contact illustrated as a first embodiment by way of example is described with reference to FIGS. 1A, 1B, 1C, 1D, 1E, 1F, 2, 3A, 3B, 3C, 3D, 3E and 4. FIGS. 1A through 1F are a plan view, a left side view, a front view, a right side view, a bottom view, and a perspective view, respectively, of the contact of the first embodiment.

Referring to FIGS. 1A through 1F, a contact 1 includes side guides 10, an attracted part 11, a bottom part 12, a first spring 13, a second spring 14, and a third spring 15.

The side guides 10 are raised at a substantially right angle from the bottom part 12 so as to face each other by bent parts 100 that are positioned across the bottom part 12 from each other in widthwise directions of the contact 1 (hereinafter abbreviated to "widthwise directions"), which are a rightward and a leftward direction in FIG. 1D.

The contact 1 further includes stoppers 101 that are provided one at an upper end of each side guide 10. By coming into contact with an opposed board (not illustrated) that presses the contact 1, the stoppers 101 restrict the amount of stroke of a spring part of the contact 1 formed by the first spring 13, the second spring 14, and the third spring 15 and receives a pressing load from the opposed board, so that the stoppers 101 prevent damage to the spring part.

Each side guide 10 includes an extension part 102 that extends from the bent part 100 in a first lengthwise direction of the contact 1, which is a leftward direction in FIG. 10. A rightward direction in FIG. 1C may be referred to as "second lengthwise direction" (of the contact 1). Furthermore, the first lengthwise direction and the second lengthwise direction of the contact 1 are hereinafter collectively abbreviated to "lengthwise directions". Because the bent parts 100 are reduced in length in the lengthwise directions, it is easy to bend the bent parts 100 to raise the side guides 10.

Each extension part 102 includes a cut 103, a tapered portion 104, a horizontal portion 105, and a tapered portion 106 on its lower surface. The cut 103, the tapered portion 104, and the tapered portion 106 form gaps between the contact 1 and a board when the contact 1 is placed on the board. Because it is possible to cause a large amount of solder to flow into the gaps when soldering the contact 1 to the board, it is possible to firmly solder the contact 1 to the board.

The horizontal portion 105 is at a position slightly higher than a lower surface 12b of the bottom part 12. Accordingly, the horizontal portion 105 does not come into contact with the board when the contact 1 is placed on the board with the lower surface 12b in contact with the board. Therefore, it is possible to prevent the lower surface 12b from being separated from the board to incline the contact 1 relative to the board, and it is possible to cause solder to flow into a gap between a lower surface of the horizontal portion 105 and the board, so that it is possible to firmly solder the contact 1 to the board.

In this embodiment, the stoppers 101 are longer than the bent parts 100 in the lengthwise directions. Furthermore, the extension parts 102 make it possible to form a solder fillet elongated in the lengthwise directions. Therefore, it is possible to distribute the load of the opposed board applied to the stoppers 101 in the lengthwise directions, so that it is possible to prevent, for example, the bent parts 100 from widening and deforming in the widthwise directions to be damaged.

The attracted part 11 is provided substantially parallel to the bottom part 12 by a bent part 111 that extends from the extension part 102 of one of the side guides 10. The attracted part 11 is attracted to a suction nozzle of an automatic mounting apparatus when placing the contact 1 on the board. Because the attracted part 11 is provided on one of the side guides 10, it is possible to reduce a vertical displacement of the attracted part 11 due to pressing by the suction nozzle. Accordingly, it is possible to reduce suction errors in the automatic mounting apparatus.

Furthermore, as illustrated in FIG. 1A, an end portion 112 of the attracted part 11 is positioned over the extension part 102 of the other side guide 10. Therefore, for example, even when the attracted part 11 is pressed with a strong force by a suction nozzle, it is possible to prevent damage to the attracted part 11 by the end portion 112 coming into contact with the extension part 102.

Furthermore, the attracted part 11 is so shaped as to cover the second spring 14. Therefore, when an upward force is applied to the second spring 14 by some cause, it is possible to prevent damage to the spring part of the contact 1 by the second spring 14 coming into contact with a lower surface of the attracted part 11 to restrict the upward movement of the second spring 14.

The bottom part 12 comes into contact with the board when the contact 1 is placed on the board. The lower surface 12b of the bottom part 12 is formed to be flat for stable placement of the contact 1 on the board. The bottom part 12 includes cuts 121 and an opening 123. The cuts 121 and the opening 123 increase the amount of solder adhering to the bottom part 12 to strengthen the soldering of the contact 1 to the board when the contact 1 is bonded to the board with solder. The bottom part 12 further includes a tapered portion 122 that increases in width (a dimension in the widthwise directions) toward an end from which the first spring 13 extends.

When the third spring 15 is pressed by the opposed board, the first spring 13 firstly bends and provides the opposed board with a contact pressure. The first spring 13 includes a bent portion 131 and a tapered portion 132. The bent portion 131 is bent in a direction to bend a surface extending from an upper surface 12a of the bottom part 12 inward. This direction of bending is referred to as "first bending direction." A direction that is opposite to the first bending direction, that is, a direction to bend the surface extending from the upper surface 12a outward, is referred to as "second bending direction."

When performing soldering, a fillet is formed on part of the bent portion 131 that extends from the bottom surface 12b of the bottom part 12 and rises from the board on which the contact 1 is placed.

The width of the first spring 13 in the widthwise directions in the tapered portion 132 is smaller than the interval between the opposed side guides 10 in the widthwise directions. The second spring 14 extends from the tapered portion 132.

The second spring 14 is an area of displacement that is displaced when the first spring 13 bends, and extends up to a part that comes into contact with the upper surface 12a of the bottom part 12 when the second spring 14 is displaced. The extension parts 102 of the side guides 10 are formed so as to protect this area of displacement. The second spring 14 is described in detail with reference to FIG. 2. FIG. 2 is a cross-sectional view of the contact 1 taken along a plane including line A-A in FIG. 1E. In FIG. 2, a bold solid line running through the bottom part 12, the first spring 13, the second spring 14, and the third spring 15 indicates the center of the contact 1 in its thickness direction.

Referring to FIG. 2, the second spring 14 includes a bent portion 141, a bent portion 142, a horizontal portion 143, and a bent portion 144. The bent portion 141 bends the second spring 14 in the first bending direction. The bent portion 142 bends the second spring 14 in the second bending direction so as to make the horizontal portion 143 extending from the bent portion 142 substantially horizontal relative to the bottom part 12 in the lengthwise directions. The bent portion 144 bends the second spring 14 in the second bending direction.

When the first spring 13 is pressed by the opposed board and bends, the bent portion 144 extending from the horizontal portion 143 comes into contact with the upper surface 12a of the bottom part 12 to be electrically short-circuited with the upper surface 12a, so as to form an electrical conduction path that does not go through the first spring 13.

The bent portion 141 and the bent portion 142 cause an upper surface of the horizontal portion 143 to be lower than a lower surface of the attracted part 11. As a result, a displacement of the second spring 14 in the upward direction in FIG. 2 is restricted by the attracted part 11.

The third spring 15 extends from the second spring 14. The third spring 15 includes a straight portion 151, a bent portion 152, a horizontal portion 153, a bent portion 154, a tapered portion 155, a bent portion 156, a straight portion 157, and a bent portion 158. Furthermore, the third spring 15 is provided with a slit 150 that extends from the horizontal portion 143 of the second spring 14 to the bent portion 154 of the third spring 15 through the bent portion 144 of the second spring 14.

The straight portion 151 extends from the bent portion 144 in a direction away from the bottom part 12. The bent portion 152 extends from the straight portion 151 and bends the third spring 15 in the first bending direction to make the horizontal portion 153 extending from the bending portion 152 substantially horizontal relative to the bottom part 12.

The bent portion 154 extends from the horizontal portion 153 to the tapered portion 155, and bends the third spring 15 in the second bending direction. When the bent portion 144 stretches after coming into contact with the upper surface 12a of the bottom part 12, the bent portion 154 comes into contact with the upper surface 12a to be electrically short-circuited with the upper surface 12, so as to form another electrical conduction path that does not go through the first spring 13.

The tapered portion 155 makes the width (dimension in the widthwise directions) of the third spring 15 smaller than the width of the slit 150, and extends to the bent portion 156.

The bent portion 156 extends to the straight portion 157, and bends the third spring 15 in the second bending direction. The bent portion 156 comes into contact with the opposed board to be pressed by the opposed board.

The bent portion 158 extends from the straight portion 157, and bends the third spring 15 in the second bending direction. When the bent portion 156 is pressed by the opposed board, the bent portion 158 comes into contact with the upper surface 12a of the bottom part 12 mainly by the bending of the bent portion 154 to be electrically short-circuited with the upper surface 12a, so as to form an electrical conduction path.

As illustrated in FIGS. 1A, 1B and 1D, the slit 150 has a width that is greater than the width of each of the bent portion 156, the straight portion 157, and the bent portion 158 in the widthwise directions. Furthermore, in the second lengthwise direction, the slit 150 extends from the horizontal portion 143 to the bent portion 154, and is formed in the part between a slit end point 1501 and a slit end point 1502 not indicated by oblique lines in the cross-sectional view of FIG. 2. The bent portion 158 extends to a position where an end part of the bent portion 158 is inserted in the slit 150.

The slit 150 changes its shape in accordance with a change in the bending angle of the bent portion 152. For example, when the bending angle of the bent portion 152 decreases, the bending angle of part of the slit 150 in the bent portion 152 decreases. Therefore, the straight-line distance from the slit end point 1501 to the slit end point 1502 increases. The slit 150 is so shaped as to prevent an end part of the bent portion 158 from touching the slit end point 1502 even when the shape of the third spring 15 has changed. Accordingly, the bending of the third spring 15 is not restricted by the slit 150.

Next, changes in the shape of the spring part including the first spring 13, the second spring 14, and the third spring 15 caused when the contact 1 attached to the board by soldering or the like is pressed by the opposed board in the first embodiment are described with reference to FIGS. 3A through 3E. FIGS. 3A through 3E are diagrams illustrating a displacement of a contact in the first embodiment.

Figure 3A:
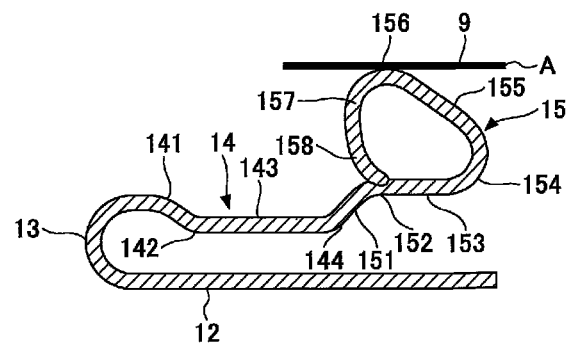
FIGS. 3A, 3B, 3C, 3D and 3E are diagrams illustrating a displacement of a contact in the first embodiment.

Position A of a board 9 (opposed board) in FIG. 3A is a position where the board 9 comes into contact with the bent portion 156. The board 9 does not press the bent portion 156 at Position A. Therefore, the spring part shows an initial shape without deformation.

Figure 3B:
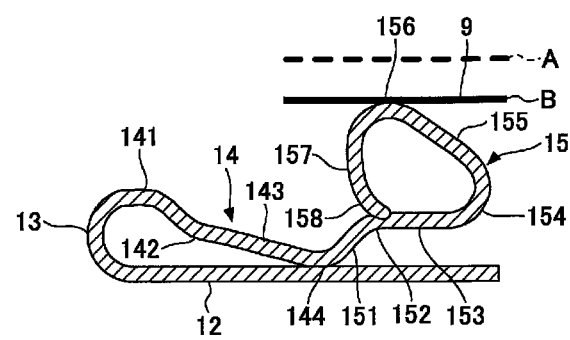

Position B of the board 9 in FIG. 3B is a position where the bent portion 144 comes into contact with the bottom part 12 by pressing by the board 9. The board 9 moves from Position A to Position B while pressing the bent portion 156, so that mainly the first spring 13 bends so as to displace the second spring 14 downward in FIG. 3B. As a result, the horizontal portion 143 becomes inclined toward bottom right in FIG. 3B, so that, first, the bent portion 144 comes into contact with the bottom part 12. As a result of the bent portion 144 coming into contact with the bottom part 12, the bent portion 144 and the bottom part 12 are electrically short-circuited to form an electrical conduction path that does not go through the first spring 13 between the bent portion 156 and the bottom part 12, so that it is possible to reduce electrical resistance compared with the state of FIG. 3A.

Figure 3C:
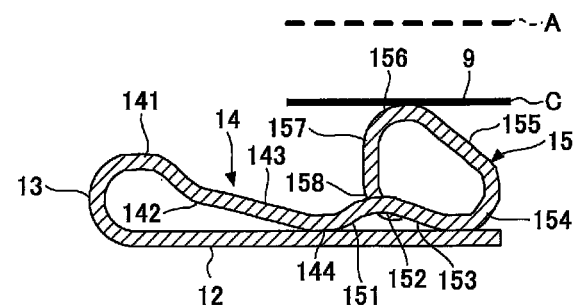

Position C of the board 9 in FIG. 3C is a position where the bent portion 154 comes into contact with the bottom part 12 by pressing by the board 9. The board 9 moves from Position B to Position C while further pressing the bent portion 156, so that the bent portion 144 in contact with the bottom part 12 mainly stretches so as to move the third spring 15 downward in FIG. 3C. Consequently, the bent portion 154 comes into contact with the bottom part 12. As a result of the bent portion 154 coming into contact with the bottom part 12, an electrical conduction path short-circuited by the bent portion 154 is formed between the bent portion 156 and the bottom part 12, so that it is possible to reduce electrical resistance compared with the state of FIG. 3B.

In this embodiment, the first spring 13 and the second spring 14 are designed so that the bent portion 154 comes into contact with the bottom part 12 after the bent portion 144 comes into contact with the bottom part 12. Alternatively, for example, the first spring 13 and the second spring 14 may be designed so that the bent portion 144 and the bent portion 154 come into contact with the bottom part 12 at substantially the same time. As another alternative, for example, the bent portion 152 may stretch to cause the bent portion 144 to come into contact with the bottom part 12 after the bent portion 154 comes into contact with the bottom part 12.

Figure 3D:
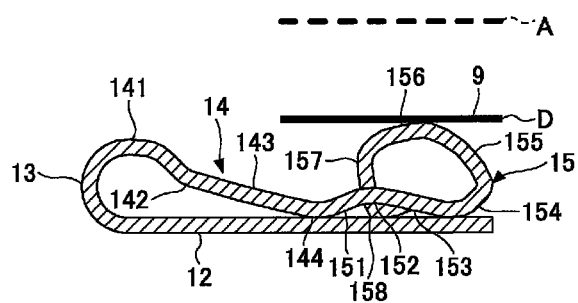

Position D of the board 9 in FIG. 3D is a position where the bent portion 158 comes into contact with the bottom part 12 by pressing by the board 9. The board 9 moves from Position C to Position D while further pressing the bent portion 156, so that mainly the bent portion 154 bends so as to move the bent portion 158 downward in FIG. 3D to come into contact with the bottom part 12. As a result of the bent portion 158 coming into contact with the bottom part 12, another electrical conduction path short-circuited by the bent portion 158 is formed between the bent portion 156 and the bottom part 12 so as to be parallel to the electrical conduction path via the bent portion 154. As a result, it is possible to further reduce electrical resistance compared with the state of FIG. 3C.

Figure 3E:
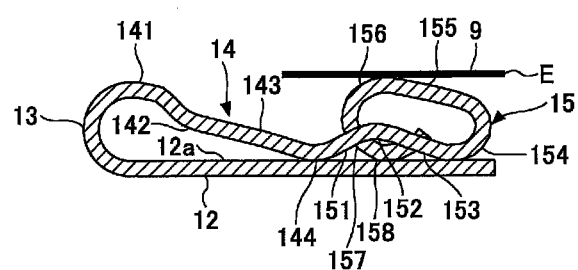

Position E of the board 9 in FIG. 3E is a position where the board 9 comes into contact with the stoppers 101 illustrated in FIG. 1 by pressing by the board 9. The board 9 moves from Position D to Position E while pressing the bent portion 156, so that the bent portion 154 and the bent portion 156 bend to cause a position at which the bent portion 158 and the bottom part 12 come into contact to slide rightward in FIG. 3E. The sliding of the contact position of the bottom part 12 and the bent portion 158 produces a wiping effect at the upper surface 12a of the bottom part 12 to remove an oxide film on the upper surface 12a of the bottom part 12, so that it is possible to maintain good electrical conduction between the bent portion 158 and the board 9.

Furthermore, when the bent portion 156 is pressed by the board 9 to bend the bent portion 154, the bent portion 152 stretches, so that the straight-line distance between the slit end point 1501 and the slit end point 1502 of the slit 150 illustrated in FIG. 2 increases. Therefore, even when the bent portion 158 slides rightward on the upper surface 12a of the bottom part 12 in FIG. 3E, an end point of the bent portion 158 does not come into contact with the slit end point 1502.

Figure 4:
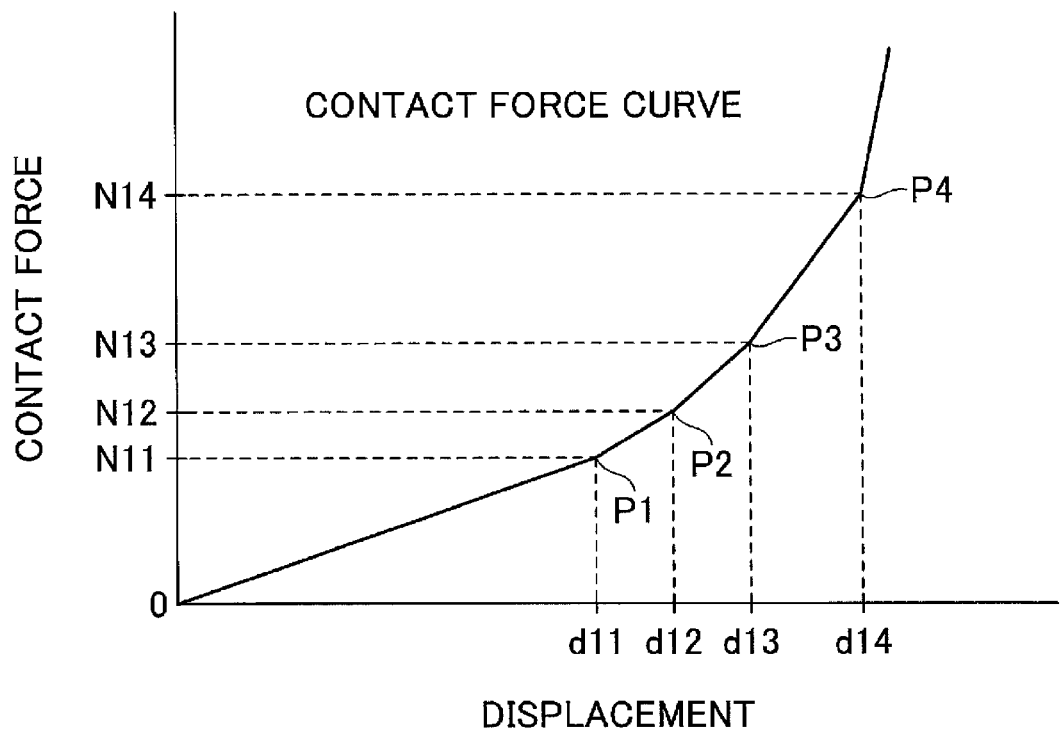
FIG. 4 is a graph illustrating a correspondence between the displacement and the contact force of a contact in the first embodiment.

Next, the relationship between the displacement of the contact 1 described with reference to FIGS. 3A through 3E and the contact force of the contact 1 is described with reference to the graph of FIG. 4. FIG. 4 is a graph illustrating a correspondence between the displacement and the contact force of a contact in the first embodiment.

In FIG. 4, the x-axis represents the displacement of the contact 1 in a direction in which the contact 1 is pressed by the opposed board, and the y-axis represents a contact force that the opposed board pressing the contact 1 receives from the contact 1 with the displacement of the contact 1.

In the graph of FIG. 4, the origin 0 represents a displacement and a contact force at the position of FIG. 3A, Point P1 represents a displacement and a contact force at the position of FIG. 3B, Point P2 represents a displacement and a contact force at the position of FIG. 3C, Point P3 represents a displacement and a contact force at the position of FIG. 3D, and Point P4 represents a displacement and a contact force at the position of FIG. 3E.

At the origin 0 of the graph, there is no displacement of the contact 1, so that no contact force is generated.

Between the origin 0 and Point P1 of the graph, a change in the displacement and a change in the contact force caused mainly by the bending of the first spring 13 are indicated. Between the origin 0 and Point P1 of the graph, a change in the contact force from 0 to N11 corresponding to a change in the displacement from 0 to d11 substantially linearly increases mainly in accordance with the spring constant of the first spring 13. When the bent portion 144 of the contact 1 comes into contact with the bottom part 12 at Point P1 of the graph, the bending of the first spring 13 is restricted by the bent portion 144.

Between Point P1 and Point P2 of the graph, a change in the displacement and a change in the contact force caused mainly by the stretching of the bent portion 144 are indicated. Between Point P1 and Point P2, a change in the contact force from N11 to N12 corresponding to a change in the displacement from d11 to d12 substantially linearly increases mainly in accordance with the spring constant of the bent portion 144.

Between Point P2 and Point P3 of the graph, a change in the displacement and a change in the contact force caused mainly by the bending of the bent portion 154 are indicated. Between Point P2 and Point P3, a change in the contact force from N12 to N13 corresponding to a change in the displacement from d12 to d13 substantially linearly increases mainly in accordance with the spring constant of the bent portion 154.

Between Point P3 and Point P4 of the graph, a change in the displacement and a change in the contact force caused mainly by the bending of the bent portion 154 and the bending of the bent portion 156 are indicated. Between Point P3 and Point P4, a change in the contact force from N13 to N14 corresponding to a change in the displacement from d13 to d14 substantially linearly increases mainly in accordance with the spring constants of the bent portion 154 and the bent portion 156.

Above Point P4 of the graph, a change in the displacement and a change in the contact force caused by the bending of the stoppers 101 are indicated. As described with reference to FIG. 1, the stoppers 101 are provided at the top of the side guides 10 that are arranged in a direction substantially perpendicular to the direction of displacement of the spring part. Therefore, when the opposed board comes into contact with and presses the contact 1, the side guides 10 that are opposed to each other across the spring part are displaced to slightly widen in the rightward and the leftward direction in FIG. 1D. Accordingly, the graph rises with a steep slope from Point P4.

[Second Embodiment]

Figure 6:
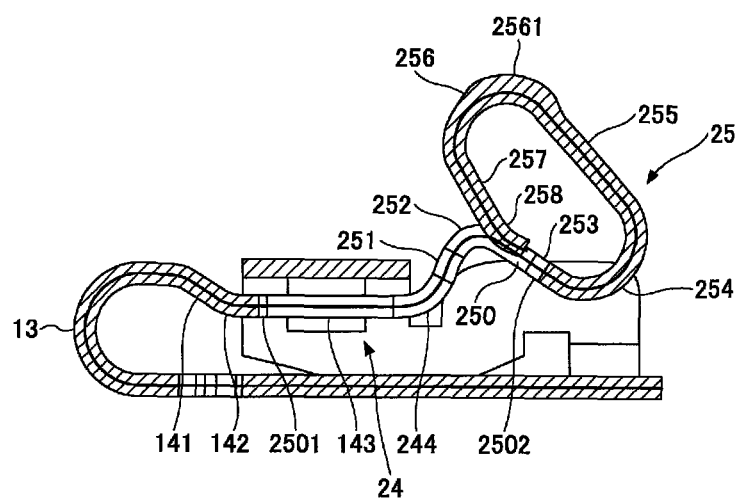
FIG. 6 is a cross-sectional view of the contact taken along a plane including line A-A in FIG. 5E.

Next, a contact illustrated as a second embodiment by way of example is described with reference to FIGS. 5A, 5B, 5C, 5D, 5E, 5F, 6, 7A, 7B, 7C, 7D, and 7E. FIGS. 5A through 5F are a plan view, a left side view, a front view, a right side view, a bottom view, and a perspective view, respectively, of the contact of the second embodiment. FIG. 6 is a cross-sectional view of the contact taken along a plane including line A-A in FIG. 5E.

In the following description, parts that are equal in shape to those of the first embodiment are referred to by the same reference numerals, some of which are omitted from the drawings in order to make differences from the first embodiment easier to visually understand. In the second embodiment, the shapes of the side guides 10, the attracted part 11, the bottom part 12, the first spring 13, and a portion of the second spring 14 from the bent portion 141 to the horizontal portion 143 are the same as illustrated in FIGS. 1A through 1E and 2 in the first embodiment, and therefore, their description is omitted.

Referring to FIGS. 5A through 5F and 6, a contact 2 of the second embodiment includes a second spring 24 and a third spring 25 in addition to the side guides 10, the attracted part 11, the bottom part 12 and the first spring 13. The second spring 24 includes the bent portion 141, the bent portion 142, the horizontal portion 143, and a bent portion 244. The third spring 25 includes a straight portion 251, a bent portion 252, a straight portion 253, a bent portion 254, a straight portion 255, a bent portion 256, a straight portion 257, and a bent portion 258. Like in FIG. 2, in FIG. 6, the center of the contact 2 in its thickness direction is indicated by a bold solid line.

The bent portion 244 is bent more in the second bending direction than the bent portion 144 of FIG. 2, and the straight portion 251 extends from the bent portion 244 more nearly vertically than the straight portion 151 of FIG. 2 in the upward direction of FIG. 6. Therefore, in FIG. 6, the bent portion 252 bends in the first bending direction at a higher position than the bent portion 152 of FIG. 2. The straight portion 253 extends from the bent portion 252 toward bottom right in FIG. 6. The bent portion 254 extending from the straight portion 253 bends in the second bending direction to extend to the straight portion 255. The bent portion 256 extends from the straight portion 255 to bend in the second bending direction.

A slit 250 is formed from a slit end point 2501 to a slit end point 2502 between the horizontal portion 143 and the straight portion 253.

The bent portion 256 includes a contact part 2561. The contact part 2561 comes into contact with the opposed board. As illustrated in FIGS. 5A through 5C and 5F, the contact part 2561 is provided in an upper part of the bent portion 256 and is formed with a width smaller than the width of the bent portion 256 in the widthwise directions. Therefore, it is possible to increase a force to contact the opposed board generated by the spring part per unit area.

The straight portion 257 extends from the bent portion 256, and the bent portion 258 that bends in the second bending direction extends from the straight portion 257.

Next, changes in the shape of the spring part including the first spring 13, the second spring 24, and the third spring 25 caused when the contact 2 is pressed by the opposed board in the second embodiment are described with reference to FIGS. 7A through 7E. FIGS. 7A through 7E are diagrams illustrating a displacement of a contact in the second embodiment.

Figure 7A:
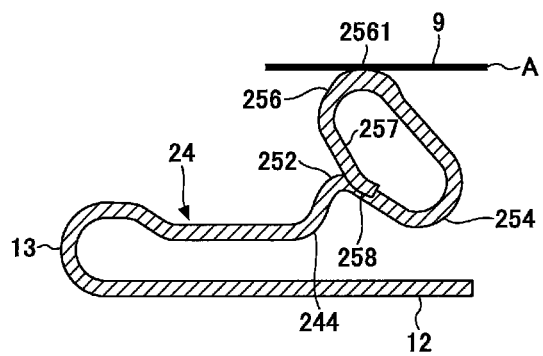
FIGS. 7A, 7B, 7C, 7D and 7E are diagrams illustrating a displacement of a contact in the second embodiment.

Position A of the board 9 in FIG. 7A is a position where the board 9 comes into contact with the contact part 2561. The board 9 does not press the contact part 2561 at Position A. Therefore, the spring part shows an initial shape without deformation.

Figure 7B:
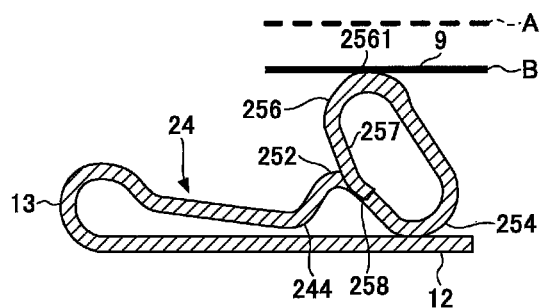

Position B of the board 9 in FIG. 7B is a position where the bent portion 254 comes into contact with the bottom part 12 by pressing by the board 9. The board 9 moves from Position A to Position B while pressing the contact part 2561, so that mainly the first spring 13 bends so as to displace the second spring 14 downward in FIG. 7B. As a result, the horizontal portion 143 becomes inclined toward bottom right in FIG. 7B, so that, first, the bent portion 254 comes into contact with the bottom part 12. As a result of the bent portion 254 coming into contact with the bottom part 12, the bent portion 254 and the bottom part 12 are electrically short-circuited to form an electrical conduction path that does not go through the first spring 13 between the contact part 2561 and the bottom part 12, so that it is possible to reduce electrical resistance compared with the state of FIG. 7A.

Figure 7C:
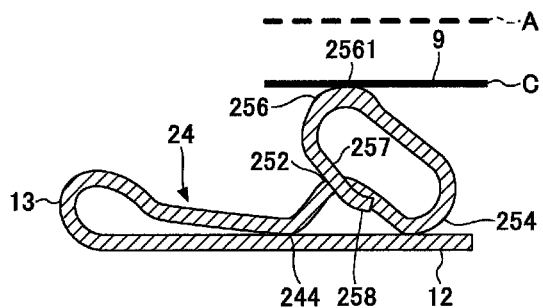

Position C of the board 9 in FIG. 7C is a position where the bent portion 144 comes into contact with the bottom part 12 by pressing by the board 9. The board 9 moves from Position B to Position C while further pressing the contact part 2561, so that the bent portion 254 bends and a position at which the bent portion 254 comes into contact with the bottom part 12 moves rightward in FIG. 7C. As a result, the bent portion 252 stretches to move the second spring 24 downward in FIG. 7C, so that the bent portion 144 comes into contact with the bottom part 12.

As a result of the bent portion 144 coming into contact with the bottom part 12, an electrical conduction path short-circuited by the bent portion 144 is formed in addition to the electrical conduction path short-circuited by the bent portion 254 between the contact part 2561 and the bottom part 12, so that it is possible to further reduce electrical resistance compared with the state of FIG. 7B.

In this embodiment, the first spring 13 and the second spring 24 are designed so that the bent portion 144 comes into contact with the bottom part 12 after the bent portion 254 comes into contact with the bottom part 12. Alternatively, for example, the first spring 13 and the second spring 24 may be designed so that the bent portion 144 and the bent portion 154 come into contact with the bottom part 12 at substantially the same time. As another alternative, for example, the bent portion 252 may stretch to cause the bent portion 254 to come into contact with the bottom part 12 after the bent portion 144 comes into contact with the bottom part 12.

Figure 7D:
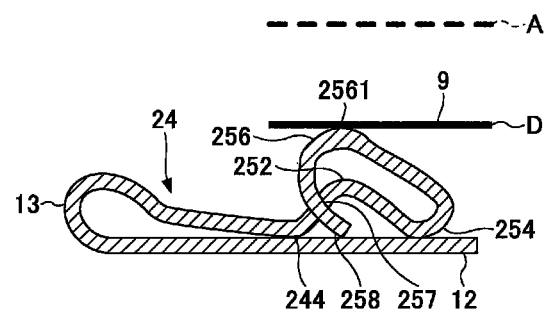

Position D of the board 9 in FIG. 7D is a position where the bent portion 258 comes into contact with the bottom part 12 by pressing by the board 9. The board 9 moves from Position C to Position D while further pressing the contact part 2561, so that mainly the bent portion 254 bends so as to move the bent portion 258 downward in FIG. 7D to come into contact with the bottom part 12. As a result of the bent portion 258 coming into contact with the bottom part 12, another electrical conduction path short-circuited by the bent portion 258 is formed between the contact part 2561 and the bottom part 12 so as to be parallel to the electrical conduction paths via the bent portion 254 and the bent portion 144. As a result, it is possible to further reduce electrical resistance compared with the state of FIG. 7C.

Figure 7E:
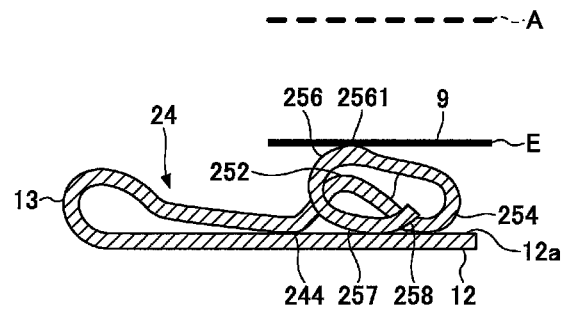

Position E of the board 9 in FIG. 7E is a position where the board 9 comes into contact with the stoppers 101 by pressing by the board 9. The board 9 moves from Position D to Position E while pressing the contact part 2561, so that the bent portion 254 and the bent portion 256 bend to cause a position at which the bent portion 258 and the bottom part 12 come into contact to slide rightward in FIG. 7E. The sliding of the contact position of the bottom part 12 and the bent portion 258 produces a wiping effect at the upper surface 12a of the bottom part 12 to remove an oxide film on the upper surface 12a of the bottom part 12, so that it is possible to maintain good electrical conduction between the bent portion 258 and the board 9.

Furthermore, when the contact part 2561 is pressed by the board 9 to bend the bent portion 254, the bent portion 252 stretches, so that the straight-line distance between the slit end point 2501 and the slit end point 2502 of the slit 250 illustrated in FIG. 6 increases. Therefore, even when the bent portion 258 slides rightward on the upper surface 12a of the bottom part 12 in FIG. 7E, an end point of the bent portion 258 does not come into contact with the slit end point 2502.

The correspondence between the displacement and the contact force of a contact in the second embodiment is the same as the correspondence in the first embodiment illustrated in the graph of FIG. 4, and accordingly, its description is omitted in the second embodiment.

[Third Embodiment]

Figure 9:
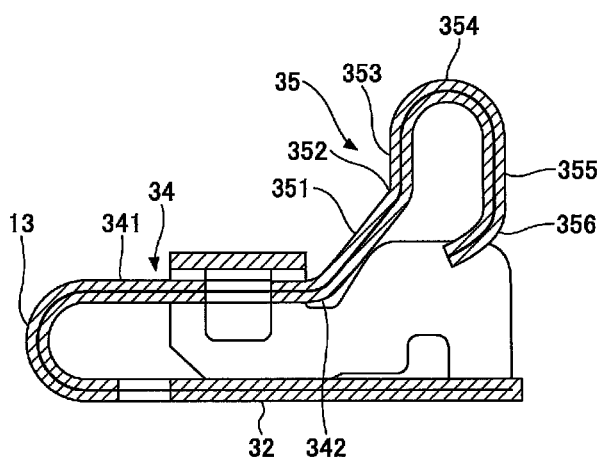
FIG. 9 is a cross-sectional view of the contact taken along a plane including line A-A in FIG. 8D.

Next, a contact illustrated as a third embodiment by way of example is described with reference to FIGS. 8A, 8B, 8C, 8D, 8E, 9, 10A, 10B, 10C, and 11. FIGS. 8A through 8E are a plan view, a left side view, a front view, a right side view, and a bottom view, respectively, of the contact of the third embodiment. FIG. 9 is a cross-sectional view of the contact taken along a plane including line A-A in FIG. 8D.

In the third embodiment, the shapes of the side guides 10, the attracted part 11, and the first spring 13 are the same as illustrated in FIGS. 1A through 1E and 2 in the first embodiment, and therefore, their description is omitted.

Referring to FIGS. 8A through 8E and 9, a contact 3 of the third embodiment includes a bottom part 32, a second spring 34, and a third spring 35 in addition to the side guides 10, the attracted part 11, and the first spring 13. The bottom part 32 includes cuts 321, cuts 322, and an opening 323. Like in the first embodiment, the cuts 321, the cuts 322, and the opening 323 are provided so as to strengthen soldering.

The second spring 34 includes a horizontal portion 341 and a bent portion 342. The third spring 35 includes a straight portion 351, a bent portion 352, a straight portion 353, a bent portion 354, a straight portion 355, and a bent portion 356.

The horizontal portion 341 includes a tapered part 3411 that extends from the first spring 13. The horizontal portion 341 extends substantially parallel to the base part 32 from the first spring 13 to the bent portion 342.

The bent portion 342 bends in the second bending direction to extend to the straight portion 351. The bent portion 352 extending from the straight portion 351 bends in the second bending direction to raise the straight portion 353 extending from the bent portion 352 at a substantially right angle to the bottom part 32. The bent portion 354 extending from the straight portion 353 bends in the first bending direction. As illustrated in FIGS. 8A and 8C, the bent portion 354 includes a contact part 3541 at the top of the bent portion 354.

The straight portion 354 that extends from the bent portion 354 falls at a substantially right angle to the bottom part 32. As illustrated in FIG. 8D, the straight portion 355 is tapered to become narrower toward a lower end. The bent portion 356 extending from the straight portion 355 bends in the first bending direction.

Figure 10A:
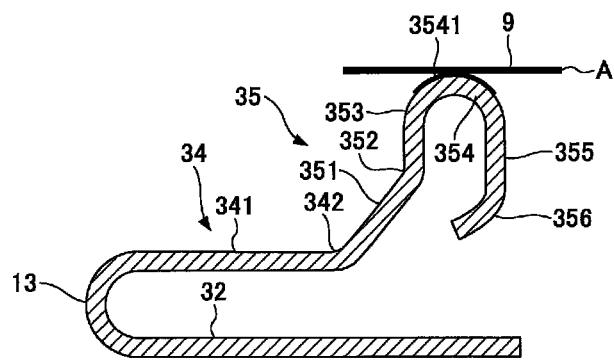
FIGS. 10A, 10B and 10C are diagrams illustrating a displacement of a contact in the third embodiment.

Next, changes in the shape of the spring part including the first spring 13, the second spring 34, and the third spring 35 caused when the contact 3 is pressed by the opposed board in the third embodiment are described with reference to FIGS. 10A through 10O. FIGS. 10A through 10O are diagrams illustrating a displacement of a contact in the third embodiment.

Position A of the board 9 in FIG. 10A is a position where the board 9 comes into contact with the contact part 3541. The board 9 does not press the contact part 3541 at Position A. Therefore, the spring part shows an initial shape without deformation.

Figure 10B:
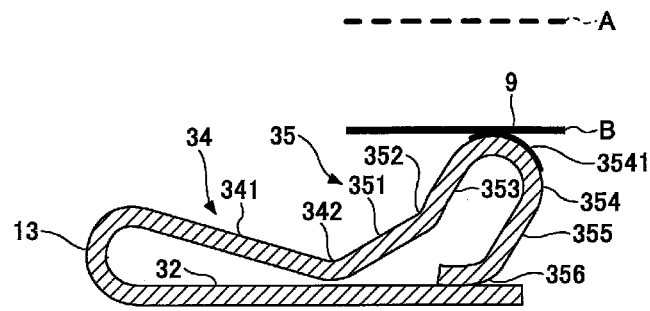

Position B of the board 9 in FIG. 10B is a position where the bent portion 356 comes into contact with the bottom part 32 by pressing by the board 9. The board 9 moves from Position A to Position B while pressing the contact part 3541, so that mainly the first spring 13 bends so as to displace the second spring 34 downward in FIG. 10B. As a result, the horizontal portion 341 becomes inclined toward bottom right in FIG. 10B, so that, first, the bent portion 356 comes into contact with the bottom part 32. As a result of the bent portion 356 coming into contact with the bottom part 32, the bent portion 356 and the bottom part 32 are electrically short-circuited to form an electrical conduction path that does not go through the first spring 13 between the contact part 3541 and the bottom part 32, so that it is possible to reduce electrical resistance compared with the state of FIG. 10A.

Position C of the board 9 in FIG. 10O is a position where the board 9 comes into contact with the stoppers 101 by pressing by the board 9. The board 9 moves from Position B to Position C while pressing the contact part 3541, so that mainly the first spring 13 and the bent portion 354 bend to cause a position at which the bent portion 356 and the bottom part 32 come into contact to slide leftward in FIG. 100. The sliding of the contact position of the bottom part 32 and the bent portion 356 produces a wiping effect at the upper surface 32a of the bottom part 32 to remove an oxide film on the upper surface 32a of the bottom part 32, so that it is possible to maintain good electrical conduction between the bent portion 356 and the board 9.

Figure 11:
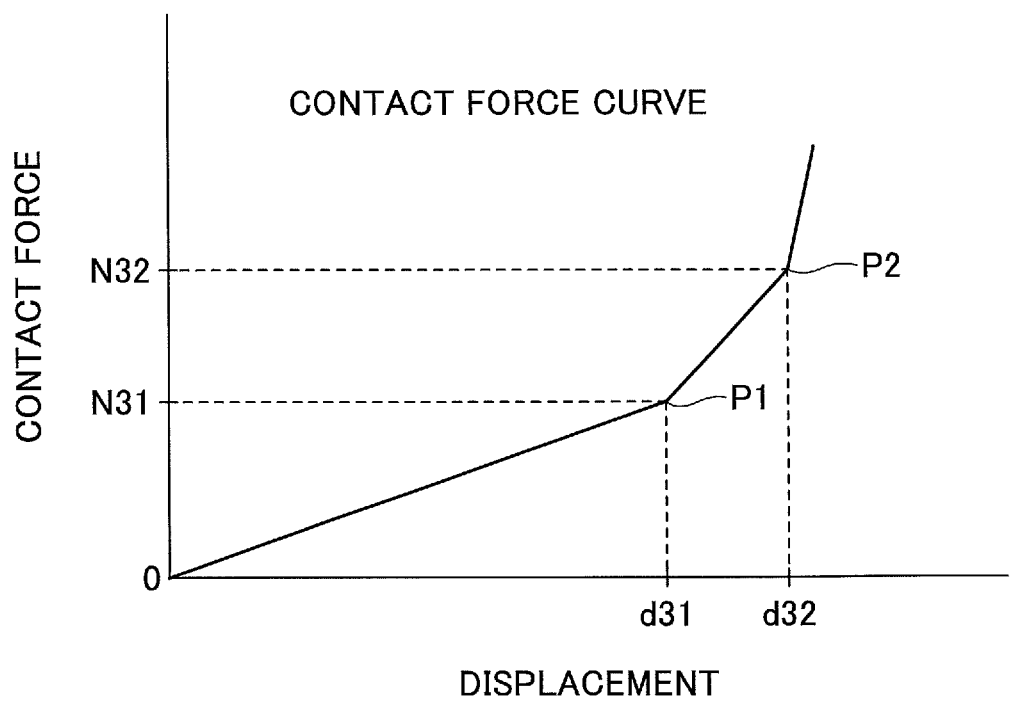
FIG. 11 is a graph illustrating a correspondence between the displacement and the contact force of a contact in the third embodiment.
Figure 12:
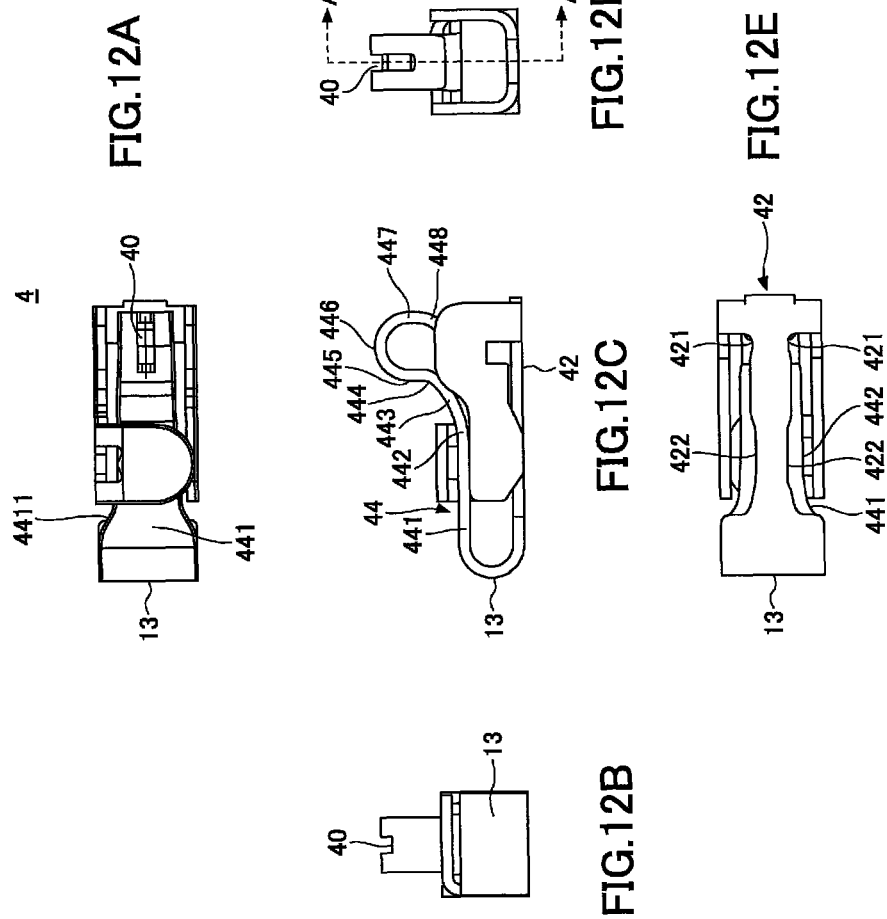
FIGS. 12A, 12B, 12C, 12D and 12E are a plan view, a left side view, a front view, a right side view, and a bottom view, respectively, of a contact according to a fourth embodiment.

Next, the relationship between the displacement and the contact force of the contact 3 in the third embodiment is described with reference to the graph of FIG. 11. FIG. 11 is a graph illustrating a correspondence between the displacement and the contact force of a contact in the third embodiment. Like in FIG. 2, in FIG. 11, the center of the contact 3 in its thickness direction is indicated by a bold solid line.

Figure 10C:
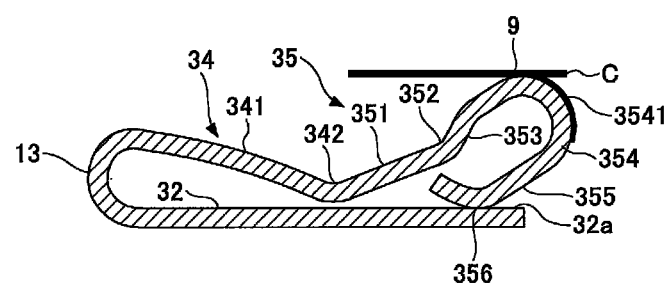

In the graph of FIG. 11, the origin 0 represents a displacement and a contact force at the position of FIG. 10A, Point P1 represents a displacement and a contact force at the position of FIG. 10B, and Point P2 represents a displacement and a contact force at the position of FIG. 10C.

Between the origin 0 and Point P1 of the graph, a change in the displacement and a change in the contact force caused mainly by the bending of the first spring 13 due to pressing by the opposed board are indicated. Between the origin 0 and Point P1 of the graph, a change in the contact force from 0 to N31 corresponding to a change in the displacement from 0 to d31 substantially linearly increases mainly in accordance with the spring constant of the first spring 13. The bent portion 356 of the contact 3 comes into contact with the bottom part 32 at Point P1 of the graph.

Between Point P1 and Point P2 of the graph, a change in the displacement and a change in the contact force caused mainly by the bending of the bent portion 354 and the stretching of the bent portion 342 and the bent portion 352 are indicated. Between Point P1 and Point P2, a change in the contact force from N31 to N32 corresponding to a change in the displacement from d31 to d32 substantially linearly increases mainly in accordance with the spring constants of the bent portion 354, the bent portion 342, and the bent portion 352. The opposed board 9 comes into contact with the stoppers 101 at Point P2.

Above Point P2 of the graph, a change in the displacement and a change in the contact force caused by the bending of the stoppers 101 described with reference to FIG. 4 are indicated.

[Fourth Embodiment]

Figure 13:
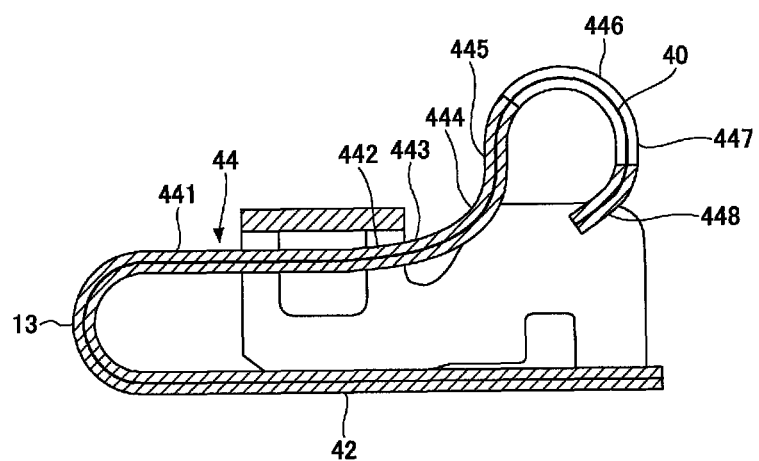
FIG. 13 is a cross-sectional view of the contact taken along a plane including line A-A in FIG. 12D.

Next, a contact illustrated as a fourth embodiment by way of example is described with reference to FIGS. 12A, 12B, 12C, 12D, 12E, 13, 14A, 14B, and 15. FIGS. 12A through 12E are a plan view, a left side view, a front view, a right side view, and a bottom view, respectively, of the contact of the fourth embodiment. FIG. 13 is a cross-sectional view of the contact taken along a plane including line A-A in FIG. 12D.

In the fourth embodiment, the shapes of the side guides 10, the attracted part 11, and the first spring 13 are the same as illustrated in FIGS. 1A through 1E and 2 in the first embodiment, and therefore, their description is omitted.

Referring to FIGS. 12A through 12E and 13, a contact 4 of the fourth embodiment includes a bottom part 42 and a second spring 44 in addition to the side guides 10, the attracted part 11, and the first spring 13. The bottom part 42 includes cuts 421 and cuts 422. Like in the first embodiment, the cuts 421 and the cuts 422 are provided so as to strengthen soldering. Furthermore, like in FIG. 2, in FIG. 13, the center of the contact 4 in its thickness direction is indicated by a bold solid line.

The second spring 44 includes a horizontal portion 441, a bent portion 442, a straight portion 443, a bent portion 444, a straight portion 445, a bent portion 446, a straight portion 447, and a bent portion 448.

The horizontal portion 441 includes a tapered part 4411 that extends from the first spring 13. The horizontal portion 441 extends substantially parallel to the bottom part 42 from the first spring 13 to the bent portion 442.

The bent portion 442 bends in the second bending direction to extend to the straight portion 443. The straight portion 443 extends to the bent portion 444. The straight portion 445 extends from the bent portion 444 to the bent portion 446. The bent portion 446 bends in the first bending direction to extend to the straight portion 447. The straight portion 447 extends to the bent portion 448.

The bent portion 446 and the straight portion 447 include a slit 40. The bent portion 446 comes into contact with the opposed board. Accordingly, the bent portion 446 comes into contact with the opposed board at two points that are separated in the widthwise directions by the slit 40.

Figure 14A:
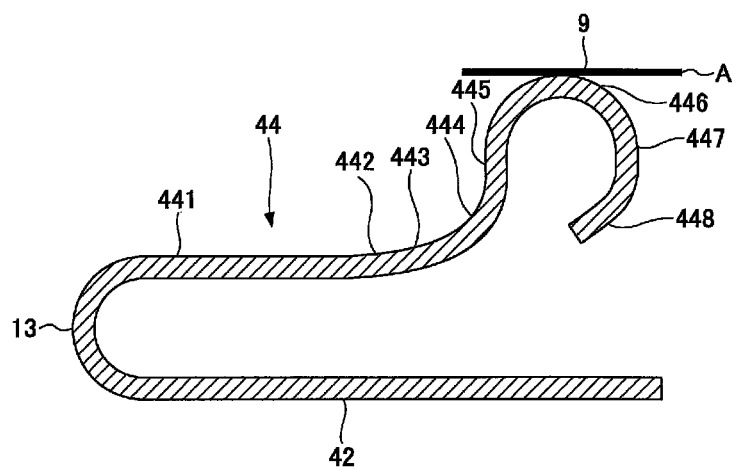
FIGS. 14A and 14B are diagrams illustrating a displacement of a contact in the fourth embodiment.
Figure 14B:
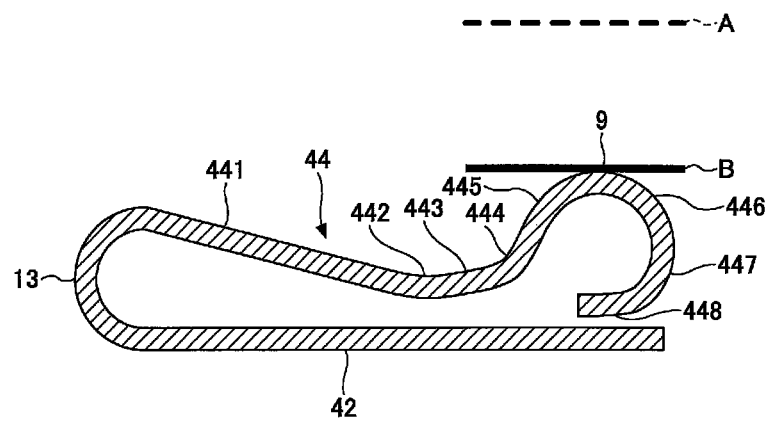

Next, changes in the shape of the spring part including the first spring 13 and the second spring 44 caused when the contact 4 is pressed by the opposed board in the fourth embodiment are described with reference to FIGS. 14A and 14B. FIGS. 14A and 14B are diagrams illustrating a displacement of a contact in the fourth embodiment.

Position A of the board 9 in FIG. 14A is a position where the board 9 comes into contact with the bent portion 446. The board 9 does not press the bent portion 446 at Position A. Therefore, the spring part shows an initial shape without deformation.

Position B of the board 9 in FIG. 14B is a position where the board 9 is pressed to come into contact with the stoppers 101. The board 9 moves from Position A to Position B while pressing the bent portion 446, so that mainly first spring 13 bends. In this embodiment, the spring part does not come into contact with the bottom part 42.

Figure 15:
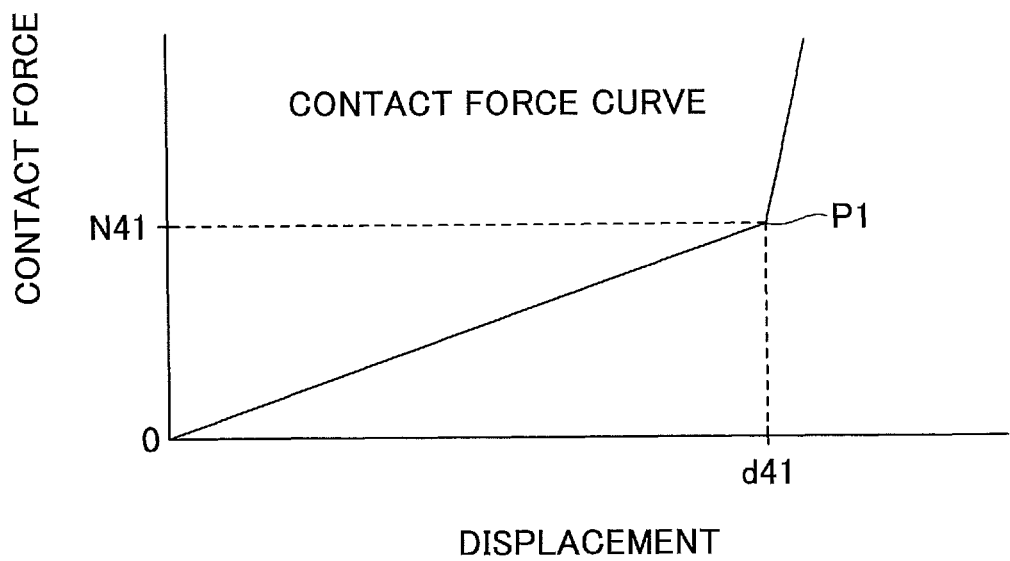
FIG. 15 is a graph illustrating a correspondence between the displacement and the contact force of a contact in the fourth embodiment.

Next, the relationship between the displacement and the contact force of the contact 4 in the fourth embodiment is described with reference to the graph of FIG. 15. FIG. 15 is a graph illustrating a correspondence between the displacement and the contact force of a contact in the fourth embodiment.

In the graph of FIG. 15, the origin 0 represents a displacement and a contact force at the position of FIG. 14A and Point P1 represents a displacement and a contact force at the position of FIG. 14B.

Between the origin 0 and Point P1 of the graph, a change in the displacement and a change in the contact force caused mainly by the bending of the first spring 13 due to pressing by the opposed board are indicated. Between the origin 0 and Point P1 of the graph, a change in the contact force from 0 to N41 corresponding to a change in the displacement from 0 to d41 substantially linearly increases mainly in accordance with the spring constant of the first spring 13. The opposed board 9 comes into contact with the stoppers 101 at Point P1 of the graph.

Above Point P1 of the graph, a change in the displacement and a change in the contact force caused by the bending of the stoppers 101 described with reference to FIG. 4 are indicated.

Next, the formation of a solder fillet at the time of soldering a contact to a board is described with reference to FIGS. 16A, 16B, 16C, 16D and 16E. FIGS. 16A through 16E are diagrams illustrating formation of a fillet on a contact according to the first embodiment. In FIGS. 16A through 16E, which correspond to FIGS. 1A through 1E, respectively, solder is indicated by a dot pattern.

Referring to FIG. 16C, solder flows into a space under each side guide 10 to form a fillet continuous in the lengthwise directions.

Furthermore, the fillet is formed on the outer sides of the side guides 10 in the widthwise directions as illustrated in FIG. 16D. Accordingly, the solder fillet makes it less likely for the side guides 10 to widen in the widthwise directions in FIG. 16D when the stoppers 101 are pressed by the opposed board.

All examples and conditional language provided herein are intended for pedagogical purposes of aiding the reader in understanding the invention and the concepts contributed by the inventors to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

What is claimed is:

1. A contact that is formed of a metal plate having a first surface and a second surface opposite to the first surface, and electrically connects a first board and a second board, the contact comprising:
    a bottom part to be joined to the first board;
    a first spring that is bent in a first bending direction to bend the first surface outward and the second surface inward, the first spring extending from the bottom part;
    a second spring including a bent portion bent in the second bending direction to bend the first surface inward and the second surface outward, and configured to be displaced in a first direction toward the bottom part and in a second direction opposite to the first direction by deformation of the first spring; and
    a third spring extending from the second spring, and including
        a first portion extending from the bent portion of the second spring and bent in the first bending direction;
        a second portion extending from the first portion and bent in the second bending direction;
        a third portion extending from the second portion and bent in the second bending direction; and
        an end portion extending from the third portion, and bent in the second bending direction,
    wherein, when the contact is pressed by the second board, the end portion comes into contact with the bottom part after the second portion or the bent portion comes into contact with the bottom part.

2. The contact as claimed in claim 1, further comprising:
    a plurality of side guides rising from the bottom part, wherein the side guides include respective extension parts configured to protect an area in which the second spring is displaced.

3. The contact as claimed in claim 2, further comprising:
    a stopper provided at an end of each of the side guides in the second direction and configured to come into contact with the second board.

4. The contact as claimed in claim 3, wherein
    each of the side guides includes a bent part extending from the bottom part,
    the extension part of each of the side guides extends from the bent part, and the stopper extends over an end of the bent part in the second direction and an end of the extension part in the second direction in each of the side guides.

5. The contact as claimed in claim 2, wherein each of the extension parts includes a cut at an end of the extension part in the first direction.

6. The contact as claimed in claim 2, further comprising:
an attracted part extending substantially parallel to the bottom part from one of the extension parts.

7. The contact as claimed in claim 2, wherein the side guides are opposed to each other across the second spring.

8. The contact as claimed in claim 1, wherein
when the contact is pressed by the second board, the second portion comes into contact with the bottom part after the bent portion comes into contact with the bottom part, and the end portion comes into contact with the bottom part after the second portion comes into contact with the bottom part.

9. The contact as claimed in claim 1, wherein
when the contact is pressed by the second board, the bent portion comes into contact with the bottom part after the second portion comes into contact with the bottom part, and the end portion comes into contact with the bottom part after the bent portion comes into contact with the bottom part.

10. A contact that is formed of a metal plate having a first surface and a second surface opposite to the first surface, and electrically connects a first board and a second board, the contact comprising:
a bottom part to be joined to the first board;
a first spring that is bent in a first bending direction to bend the first surface outward and the second surface inward, the first spring extending from the bottom part;
a second spring configured to be displaced in a first direction toward the bottom part and in a second direction opposite to the first direction by deformation of the first spring; and
a third spring extending from the second spring, and including
a first portion extending from the second spring and bent in the first bending direction;
a second portion extending from the first portion and bent in a second bending direction to bend the first surface inward and the second surface outward;
a third portion extending from the second portion and bent in the second bending direction; and
an end portion extending from the third portion, and bent in the second bending direction,
wherein, when the third spring is pressed by the second board, the end portion contacts the bottom part after the second portion contacts the bottom part.

* * * * *